Figure 1:
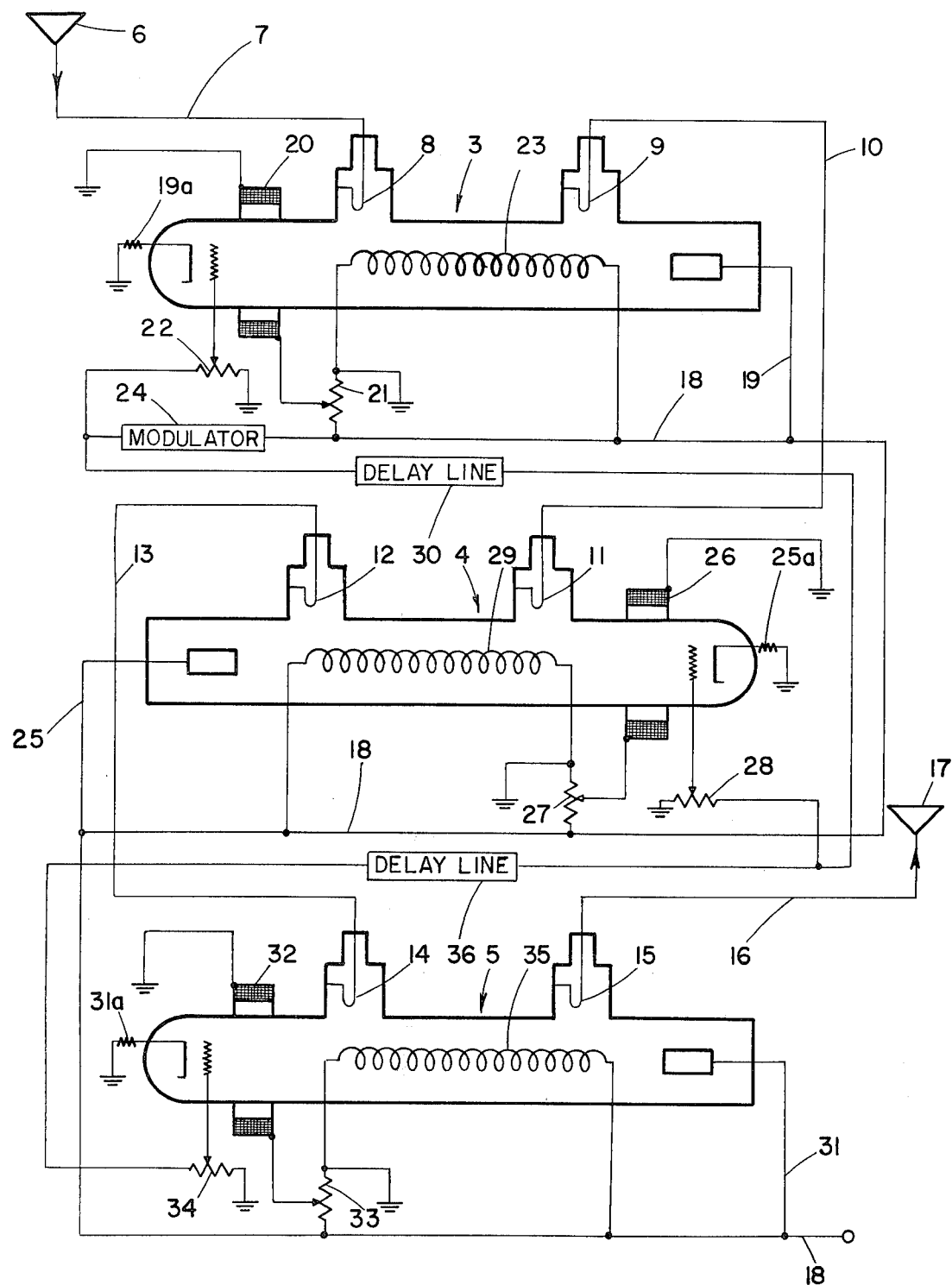

United States Patent [19]

Greene

[11] 4,119,920
[45] Oct. 10, 1978

[54] PULSED REPEATER AMPLIFIER
[75] Inventor: Jack C. Greene, Syosset, N.Y.
[73] Assignee: The United States of America as represented by the Secretary of the Navy, Washington, D.C.
[21] Appl. No.: 809,893
[22] Filed: Apr. 29, 1959
[51] Int. Cl.² .............................................. H03F 3/58
[52] U.S. Cl. .................................................... 330/43
[58] Field of Search .................... 330/43, 44, 150, 152; 250/15

[56] References Cited
U.S. PATENT DOCUMENTS 2,770,722  11/1956  Arams ...................................... 330/43
2,849,545   8/1958  Mendel .................................... 330/43

Primary Examiner—Nelson Moskowitz
Attorney, Agent, or Firm—R. S. Sciascia; Henry Hansen

EXEMPLARY CLAIM

1. A pulsed repeater amplifier circuit comprising three traveling wave tubes, each said tube having a helical coil disposed therewithin; an input antenna; an output antenna; means connecting the said antennas and the said tubes in cascade so that a wave received on the input antenna is conducted successively through the said three tubes to the output antenna; means for establishing a predetermined electrostatic field about the helical coil in each tube; and means responsive to an individual modulating signal on the control grid of each tube for amplifying the wave during perdetermined intervals as it travels through each tube.

3 Claims, 2 Drawing Figures

U.S. Patent   Oct. 10, 1978   Sheet 1 of 2   4,119,920

INVENTOR.
Jack C. Greene

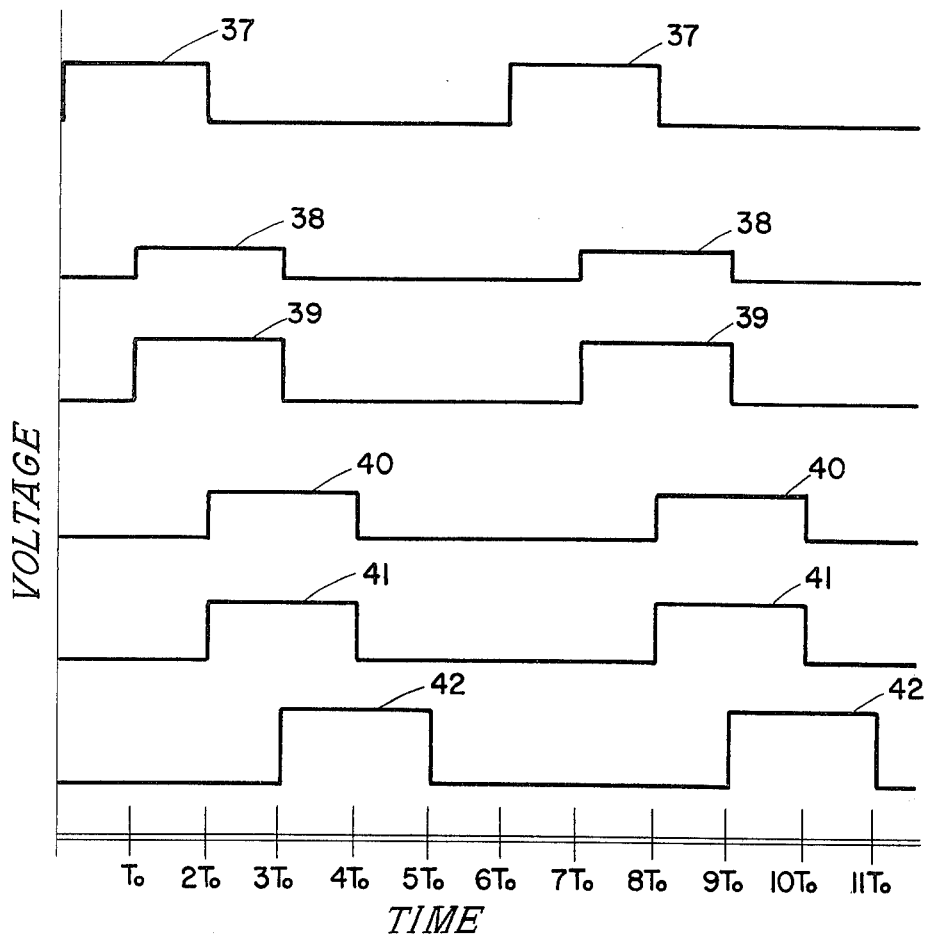

PULSED REPEATER AMPLIFIER

The present invention relates to pulsed radio-frequency amplifiers and more particularly to pulsed radio-frequency amplifiers which utilize cascaded traveling wave tubes.

In conventional repeater jammer circuits the dual antenna pulsed repeater amplifier, wherein high gain is required and wherein the signal must be delayed for an appreciable interval before it is relayed, is oftentimes found particularly useful. One frequent objection to the use of the dual antenna amplifier, however, involves the degree of coupling between the input and output antennas. Even though these two antennas may be well shielded and isolated from one another, it is often difficult to obtain suitable attenuation between them to prevent feedback through the amplifier and avoid sustained oscillations therein.

Accordingly, it is a principal object of the present invention to provide a high gain dual antenna pulsed amplifier which will not break into oscillation.

It is a further object of the present invention to provide a novel and improved dual antenna pulsed amplifier which includes a plurality of traveling wave tubes arranged in cascade wherein the interval between the time that one tube is pulsed on and the time the next tube is pulsed on is equal to the time delay of the signal in passing through the said one tube.

It is a still further object of the present invention to provide a novel and improved high gain dual antenna amplifier having a plurality of control grid pulse modulated traveling wave tubes connected in cascade wherein the time interval between the time that the control grid of one tube is pulsed and the time that the control grid of the next tube is pulsed is equal to the time delay of passage of the signal through said one tube.

Other objects and many of the attendant advantages of this invention will be readily appreciated as the same becomes better understood by reference to the following detailed description when considered in connection with the drawings(s) wherein:

FIG. 1 is a schematic diagram of a preferred embodiment of the present invention; and FIG. 2 shows the idealized wave forms for pulsing the traveling wave tubes of the circuit of FIG. 1.

One preferred embodiment of the present invention is illustrated in FIG. 1 of the drawing. As shown therein, traveling wave tubes 3, 4, and 5 are connected in cascade in a circuit that extends from the input antenna 6 through conductor 7 to probe 8, through the waveguide portion of tube 3 to probe 9, through conductor 10 to probe 11, through the waveguide portion of tube 4 to probe 12, through conductor 13 to probe 14, through the waveguide portion of tube 5 to probe 15, and through conductor 16 to the output antenna 17. The plate circuit of tube 3 extends from the positive high voltage supply line 18 through conductor 19 and the tube to its cathode and through resistor 19a to ground. The focusing coil 20 is disposed about the neck of tube 3 as shown and is energized by a circuit that extends from the supply line 18 through potentiometer 21 and the coil to ground. The control grid of tube 3 is connected to the center-top of potentiometer 22 which is energized by a circuit that extends from the supply line 18 through the modulator 24 and through the potentiometer to ground. The helical coil 23 within tube 3 is energized by a circuit that extends from the supply line 18 through the coil to ground. The plate circuit of tube 4 extends from the supply line 18 through conductor 25 and the tube to its cathode and through resistor 25a to ground. Focusing coil 26 is disposed about the neck of tube 4 and is energized by a circuit that extends from the supply line 18 through potentiometer 27 and the coil to ground. The control grid of tube 4 is connected to the center-top of potentiometer 28 which is energized by a circuit that extends from the supply line 18 through modulator 24, through delay line 30 and through the potentiometer to ground. The helical coil 29 of tube 4 is energized by a circuit that extends from the supply line 18 through the coil to ground. The plate circuit of tube 5 extends from the supply line 18 through conductor 31 and the tube to its cathode and through resistor 31a to ground. Focusing coil 32 is disposed about the neck of tube 5 and is energized by a circuit that extends from the supply line 18 through potentiometer 33 and the coil to ground. The control grid of tube 5 is connected to the center-top of potentiometer 34 which is energized by a circuit that extends from the supply line 18 through modulator 24, through delay lines 30 and 36, and through the potentiometer to ground. The helical coil 35 of tube 5 is energized by a circuit that extends from the supply line 18 through the coil to ground.

Inasmuch as the modulator 24 and the delay line networks 30 and 36 may take a great variety of different forms, a full description of the same is not included here for the sake of simplicity. For a complete understanding of the present invention it need only be understood that each delay line introduces a delay To in the output signal from the modulator, where To is about 0.2 microseconds and is the time required for a wave to travel from the input probe to the output probe of each tube, and that the modulator 24 continuously delivers a positive high voltage pulse to the control grid of each tube for an interval of 2To and then opens up its energizing circuit for an interval of 4To.

In operation the incoming continuous wave radio frequency signal is picked up on the input antenna 6 and is successively transmitted down the length of tubes 3, 4 and 5 in the form of a wave. The electromagnetic field established by the helical coil of each tube reduces the velocity of the wave therethrough to approximately the velocity of the electron beam between the cathode and the anode of each tube. As is known in the traveling wave tube art, when the control grid of the traveling wave tube is gated on, the electron beam within the tube amplifies the bunching effect of the wave as it travels along the waveguide portion of each tube. Amplification of the wave in each tube, therefore, follows the modulation of its control grid but lags the control grid modulation pulses by a time To which is the time for the wave to travel the length of each tube. Thus, as shown in FIG. 2 of the drawing the amplified output signals 38, 40 and 42 of tubes 3, 4 and 5 respectively lag the modulation signals 37, 39 and 41 applied to the control grids of tubes 3, 4 and 5 by an interval To.

It will be noted in FIG. 2 that even if the amplified output from the third traveling wave tube 5 which is radiated from output antenna 17, no harmful self-oscillation can occur due to coupling through input antenna 6 since tube 3 is gated off when the output pulse 42 of tube 5 occurs.

Obviously many modifications and variations of the present invention are possible in the light of the above teachings. It is therefore to be understood that within the scope of the appended claims the invention may be practiced otherwise than as specifically described.

What is claimed is:

1. A pulsed repeater amplifier circuit comprising three traveling wave tubes, each said tube having a helical coil disposed therewithin; an input antenna; an output antenna; means connecting the said antennas and the said tubes in cascade so that a wave received on the input antenna is conducted successively through the said three tubes to the output antenna; means for establishing a predetermined electrostatic field about the helical coil in each tube; and means responsive to an individual modulating signal on the control grid of each tube for amplifying the wave during predetermined intervals as it travels through each tube.

2. The circuit as described in claim 1 wherein the amplifier means includes a modulator, means coupling the modulator to the control grid of the first tube, a first delay line, means coupling the modulator to the control grid of the second tube through the said first delay line, a second delay line, and means coupling the modulator to the control grid of the third tube through the said first and said second delay lines.

3. The circuit as described in claim 2 wherein each cycle of the modulator gates the control grid of each tube on for an interval of $2T_o$ and then gates them off for an interval of $4T_o$, where $T_o$ is the time required for the electron beam to travel the length of each said tube.